(12) United States Patent
Hill et al.

(10) Patent No.: US 6,753,250 B1
(45) Date of Patent: Jun. 22, 2004

(54) METHOD OF FABRICATING LOW DIELECTRIC CONSTANT DIELECTRIC FILMS

(75) Inventors: Richard S. Hill, Atherton, CA (US); Willibrordus Gerardus Maria van den Hoek, Saratoga, CA (US); Robert H. Havemann, Pleasanton, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/171,289

(22) Filed: Jun. 12, 2002

(51) Int. Cl.[7] .......................................... H01L 21/4763
(52) U.S. Cl. ....................... 438/637; 438/638; 438/672; 438/673
(58) Field of Search ............................... 438/637–639, 438/618, 622–628, 672–674

(56) References Cited

U.S. PATENT DOCUMENTS

| | | | |
|---|---|---|---|
| 5,920,790 A | * | 7/1999 | Wetzel et al. ............... 438/618 |
| 6,177,329 B1 | | 1/2001 | Pang |
| 6,268,276 B1 | | 7/2001 | Chan et al. |
| 6,329,062 B1 | | 12/2001 | Gaynor |
| 2003/0119307 A1 | * | 6/2003 | Bekiaris et al. ............. 438/638 |

FOREIGN PATENT DOCUMENTS

WO        WO95/07543        3/1995

OTHER PUBLICATIONS

"Shipley Claims Porous Low K Dielectric Breakthrough," Press Release Mar. 17, 2003.
R.D. Miller et al., "Phase–Separated Inorganic–Organic Hybrids for Microelectronic Applications," MRS Bulletin, Oct. 1997, pp. 44–48.
Jin et al., "Nanoporous Silica as an Ultralow-k Dielectric," MRS Bulletin, Oct. 1997, pp. 39–42.
Cleemput et al., "Dielectric Films With Low Dielectric Constants," Application Ser. No.: 09/727,796, filed Nov. 30, 2000.
Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569–572.
Asoh et al., "Conditions for Fabrication of Ideally Ordered Anodic Porous Alumina Using Pretextured Al," Journal of the Electrochemica Society, 148 (4) B152–B156 (2001) pp. B152–B156.
Holland et al., "Nonlithographic Technique for the Production of Large Area High Density Gridded Field Sources," J. Vac. Sci. Technol. B 17(2), Mar./Apr. 1999, pp. 580–582.
Masuda et al. "Highly Ordered Nanochannel–Array Architecture in Anodic Alumina," App. Phys. Lett. 71(19), Nov. 1997, pp. 2770–2772.
Clube et al., White Paper from Holotronic Technologies SA; downloaded from www.hdotronic.com/whitepaper/fine–pat-t.pdf on Mar. 12, 2002.
Meli et al., "Self–Assembled Masks for the Transfer of Nanometer–Scale Patterns into Surfaces: Characterization by AFM and LFM" Nano Letters, vol. 2, No. 2, 2002, 131–135.

* cited by examiner

*Primary Examiner*—Dung A. Le
(74) *Attorney, Agent, or Firm*—Beyer Weaver & Thomas, LLP

(57) ABSTRACT

Porous dielectric layers are produced by introducing small vertical or columnar gaps in pre-formed layers of dense dielectric. The pores may be formed by a special process that is different from the processes employed to form metal lines and other features on a VLSI device. Further, the columnar gaps may be produced after the planarization process for a particular layer has been completed. Then, after the pores are formed, they are capped by depositing another layer of material. In this manner, the newly porous layer is protected from direct exposure to the pressure of subsequent planarization processes. In alternative embodiments, the processes described herein are applied to introduce pores into a preformed layer of semiconductor to produce a porous semiconductor layer.

48 Claims, 9 Drawing Sheets

METHOD OF FABRICATING LOW DIELECTRIC CONSTANT DIELECTRIC FILMS

BACKGROUND

This invention relates to low dielectric constant layers for use in various applications. The invention also relates to methods of forming low dielectric constant layers having sufficient structural integrity to allow a wide range of VLSI fabrication operations.

As the features of microelectronic integrated circuits devices are reduced to smaller sizes, the electrical properties of the materials that constitute the devices will require change and improvement. One material that must be improved is the electrical insulator ("dielectric") used between the wires, metal lines, and other elements of the circuit. Without improvement in the insulator material, there will be increased problems due to capacitive effects such as coupling (crosstalk) and propagation delay. The speed at which future circuits will operate will be limited by RC delay in the interconnect. These difficulties can be mitigated by preparing the circuit using an insulating material that possesses a dielectric constant as low as possible (a "low-k" dielectric layer).

Earlier technology nodes (i.e., the set of VLSI fabrication technologies associated with a particular critical dimension) employed dense materials such as silicon dioxide, silicon nitride, and cured silsesquioxanes as insulators. However, the dielectric constants of these materials range from 3.0–7.0. These values will be inadequate for future circuits. As yet the only fully dense (non-porous) materials with a dielectric constant less than about 2.4 are fluorinated polymers or fully aliphatic hydrocarbon polymers, but these have not met requirements for adhesion and thermal stability.

Thus, considerable effort has been directed towards the development of porous dielectric materials. These can be thought of as composite materials, with the value of their dielectric constants intermediate between that of air (dielectric constant of 1.0) and the fully dense phase. Several classes of dielectric films, including porous oxides, polymers, and porous polymers have been described in the art.

Nanoporous silica films are formed by a variety of techniques. In one example, a process deposits a monomeric precursor such as tetraethyl orthosilicate or TEOS (a siloxane) onto a substrate using a solvent, and then cross-links the precursors to form a continuous porous solid network. The resultant films are dried by direct solvent evaporation or treatment with supercritical fluids. The films are then subjected to a high-temperature annealing step. See for example, Changming et al., *Materials Research Society Bulletin*, vol. 22, no. 10, pp. 39–42 (1997).

Another technique involves developing inorganic-organic nanophase-separated hybrid polymer materials. These materials comprise organic polymers cast with silsesquioxane-based ladder-type polymeric structures. A casting solvent is used to dissolve the inorganic and organic polymer components. The materials are spin coated onto a substrate and upon application of high temperature, the hybrid phase-separated polymer materials are formed. See for example, Miller et al., *Materials Research Society Bulletin*, vol. 22, no. 10, pp. 44–48 (1997).

Certain problems arise in VLSI processing of partially fabricated devices having a porous dielectric material. A first problem arises because all porous dielectric materials for integrated circuit applications are "open cell" dielectrics. In other words, the individual pores contact and open into one another. Consequently, the pores of these materials provide long paths throughout the interior of the dielectric material. Gases and liquids contacting the outer surfaces of open cell dielectric materials can thereby penetrate deep into the layer's interior. This gives rise to a particularly difficult problem during conformal depositions of conductive barrier layers or seed layers. Precursor gases or plasma for these processes can penetrate deep into the open cell matrix of the dielectric layer. There they deposit and get converted to the conductive barrier layer or seed layer. This renders large portions of the dielectric layer unacceptably conductive. Examples of extremely conformal deposition processes where the problem is most pronounced include certain forms of chemical vapor deposition (CVD) and atomic layer deposition (ALD). Note that less conformal processes such as physical vapor deposition (PVD) do not deposit conductive material within the pore network, but they do a poor job of covering the discontinuous porous side-walls of a trench or via.

Another problem arises because porous materials lack the mechanical strength of non-porous materials. As a consequence, when a planarization technique such as chemical mechanical polishing (CMP) is employed to remove excess copper or other material, the pressure applied to the wafer during that process can crack or crush the underlying dielectric material.

The current porous materials and associated processing techniques have failed to meet the demands of next generation VSLI fabrication. Obviously, the problems will only get worse as technologies move to ever smaller feature dimensions. Improved materials and processing are required.

SUMMARY

The present invention overcomes these problems with a process that creates small "pores" (typically vertical or columnar gaps) in a pre-formed layer of dense dielectric. Preferably, the pores are formed by a special process that is significantly different from the processes employed to form metal lines and other features on a VLSI device. Further, the columnar gaps are preferably produced only after the planarization process has been completed on a layer that will be made porous. As a consequence, planarization is performed on sturdy, non-porous materials. Later, after the pores are formed, they are capped by depositing another layer of material. In this manner, the newly porous layer is protected from direct exposure to the pressure of subsequent planarization processes. In alternative embodiments, the processes described herein are applied to introduce pores into a pre-formed layer of semiconductor to produce a porous semiconductor layer.

In one aspect, the invention is characterized as a method of forming a low dielectric constant dielectric layer in a semiconductor device. This method includes the following sequence: (a) depositing dielectric and conductive material to form a pattern of conductive lines in a dielectric layer; (b) planarizing the device to produce a planar layer of dielectric (with or without an exposed pattern of the conductive lines); (c) removing or leaving columnar regions of dielectric in the dielectric layer; and (d) depositing material over the columnar regions to form gaps in the dielectric material and thereby lower the effective dielectric constant of the dielectric. In this method, the columnar regions have an average feature dimension substantially smaller than the line width the conductive lines.

The conductive lines are usually a metal such as copper and the dielectric is usually a non-porous material such as silicon oxide, silicon oxycarbide, fluorinated silicate glass, silicon nitride, a spin-on organic material, a spin-on inorganic material, or a spin-on inorganic-hybrid material.

To define the columnar regions of the dielectric layer, one forms a mask over the exposed pattern of conductive lines and dielectric. Actually, two masks may be formed: a primary mask defining the pattern of columnar regions and a secondary mask that receives pattern and protects the unexposed regions during etch. Regardless of whether one or two masks are employed, some embodiments employ a metal oxide mask. Because the columnar regions serve only to introduce porosity, these regions of the mask need not be aligned with the conductive lines. Examples of mechanisms for defining the columnar regions in the mask include diffraction gratings, holographic lithography, particles in a colloidal suspension, pores in a porous material, and channels in a nanochannel array.

Usually, removing or leaving columnar regions of dielectric comprises selectively etching the dielectric layer without substantially etching the conductive lines. In some cases, a protective metal cap is selectively formed over exposed conductive lines to provide protection from the subsequent etch.

Typically, depositing material over the columnar regions comprises depositing dielectric material over the dielectric layer—including the columnar regions. In many embodiments, depositing material over the columnar regions comprises forming a metalization layer over the dielectric layer. To effectively cap the columnar regions, the overlying material is deposited by a non-conformal deposition method such as a PECVD technique.

These and other features and advantages of the present invention will be described in more detail below with reference to the associated drawings.

DETAILED DESCRIPTION

INTRODUCTION

Figure 1:
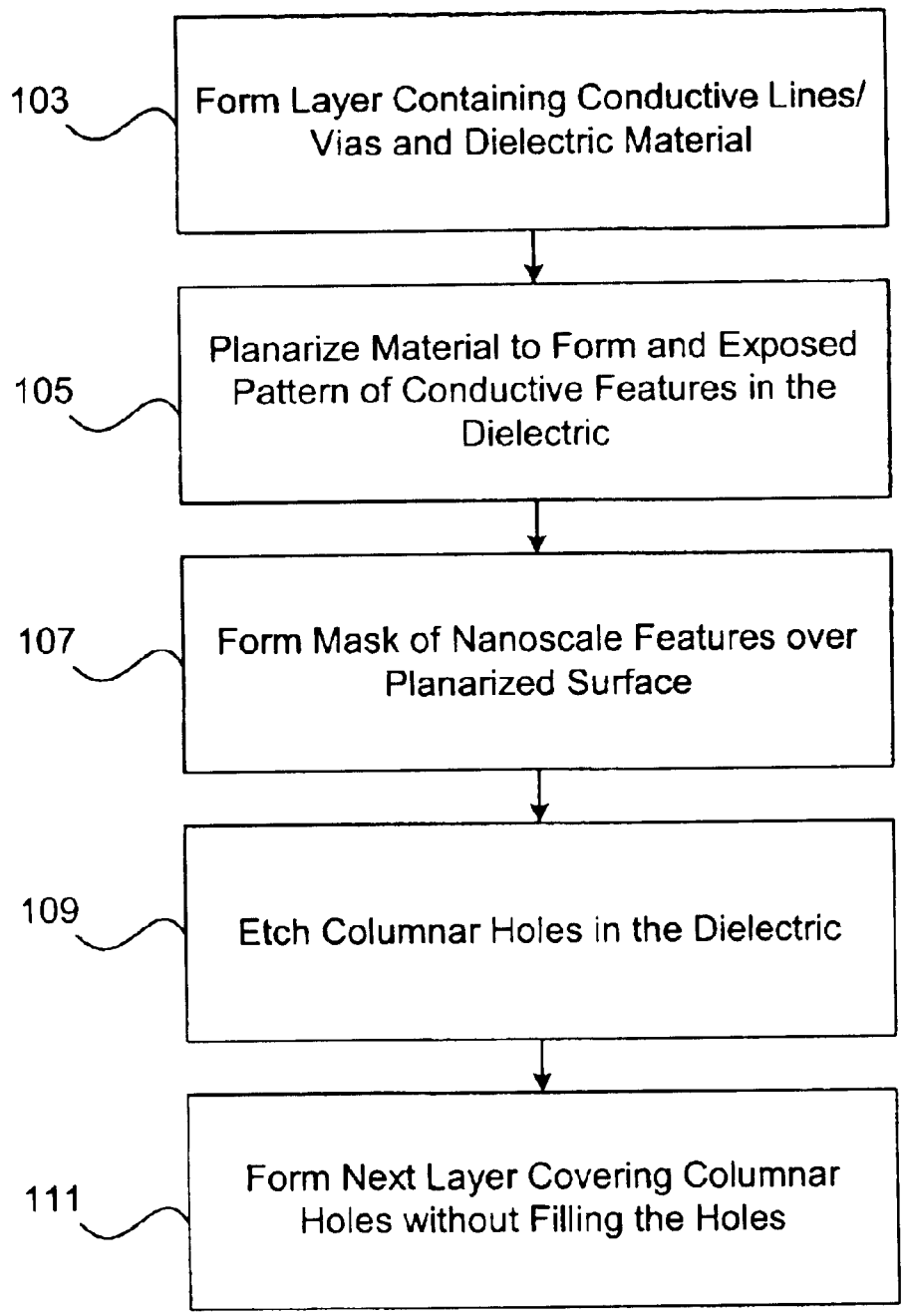
FIG. 1 is a process flow chart depicting a method of preparing low-k dielectric materials in accordance with an embodiment of this invention.

This invention pertains to devices and methods of fabricating such devices by forming columnar holes or pillars within the bulk region of a dielectric layer. These features are introduced for the same reason that dielectric materials are made porous: to reduce the effective dielectric constant of the material. In this invention, however, the significant difficulties encountered with the more conventional porous materials are reduced or eliminated. First, this invention eliminates the problems specific to open cell porous materials. Specifically, conductive materials can not penetrate to the dielectric interior regions when formed by conformal deposition processes. Second, the invention greatly reduces the porous material's susceptibility to damage during CMP or other planarization technique. This is because planarization is not performed directly on a porous layer.

These improvements come into being because the porosity of the material is introduced only after the dense material is deposited. In fact, in certain embodiments, the porosity is not introduced until after the material is deposited, etched, inlaid, and planarized. In a typical case, the material is initially deposited in the dense or non-porous state. Then it is processed in a conventional manner to produce a planarized layer of conductive features laid out in a dielectric material. Only at this point, in accordance with this invention, is the porosity introduced. Exemplary methods for performing this invention will be presented below.

The porosity introducing features (columnar structures) of the dielectric layer have certain characteristics that generally take them outside the normal realm of IC fabrication. First, these features need not be aligned with any other feature on the integrated circuit or wafer. Thus, they need not be constrained to a frame of reference based on line positions, contacts, gates, etc. Second, the size of the columnar features in the dielectric is significantly smaller than the size of the lines and other features associated with the semiconductor device design. Thus, special fabrication operations must be employed to form such small columnar features. Examples will be set forth below.

Note that—unlike typical pores—the columnar structures employed in this invention result from etching or other suitably anisotropic process. Thus, unlike pores in a porous solid, the structures are not randomly distributed in a three-dimensional orientation, but rather vary positionally in substantially only two dimensions. The distribution of the holes or pillars in those two dimensions may be periodic or aperiodic.

Preferably, the dimensions of the holes or pillars are between approximately one-tenth and one-third the feature size (e.g. line width) of the device design. In the case of the 65 nanometer technology node, this means that the holes or pillars will preferably be between approximately 5 and 25 nanometers in diameter.

TERMINOLOGY

Throughout the specification, various terms are employed to describe the new technology of this invention. Those terms may be well known to those skilled in the art. However, to ensure a consistent understanding of the terminology, the following explanations are provided.

A "defined line width" is associated with a particular technology node or design rule. It is the width of the smallest line or feature on a layer of a device. The defined line width is specified in an electronic design or layout by an integrated circuit design team. In most cases, the defined line width is chosen based upon the technical limits of the photolithography and etching processes employed at a given technology node. In many cases, "defined line width" will be synonymous with "critical dimension."

"Columnar regions" are generally vertical gaps cut into a dielectric layer from an exposed surface. Typically, the columnar regions are distributed in two dimensions over the surface of the layer. Unlike the pores of most porous materials, they are not distributed in three dimensions. The walls of the columnar regions need not be perfectly vertical. Some slope or undulation is typically encountered—as produced by the process employed to form the regions. Most typically, the process employed to form the columnar regions is an etching process.

The "feature dimensions" of the columnar regions characterize the columnar regions and may be understood as follows. The columnar regions are holes, trenches, combinations of the two, etc.; either randomly oriented or arranged in a particular pattern on a layer. Generally, such columnar regions will have a principal feature dimension on the layer surface (i.e., a two dimensional geometric feature on the two dimensional surface of the layer). That principal feature dimension may be the diameter of a hole, the width of a trench, or other geometric characteristic that principally defines the feature.

The relationship between the defined line width of a fabrication technology and the feature dimensions of the columnar regions is relevant to this invention. Generally, the feature dimensions will be substantially smaller than the defined line width.

In many cases, the dielectric materials employed at early stages in the processes of this invention are characterized as "non-porous" or "fully dense." Such materials have the desirable property of withstanding the pressures encountered in CMP and other processes employed in semiconductor device fabrication. Note that all materials can be characterized as "porous" at some sufficiently small dimension (e.g. on the order of angstroms). For purposes of this invention, if a material is characterized as non-porous, then its "pores" must be substantially smaller than the feature dimensions of the columnar regions. Preferably, the "pores" are not greater than about one-half the feature dimensions. More preferably, the pore size is not greater than about one-tenth the feature dimensions. For many practical applications of this invention, the average pore size will be smaller than 10 nanometers, and preferably no greater than a single nanometer. For example, silicon oxycarbide may be viewed as having "pores" where methyl groups reside. But the average size of these "pores" is on the order of angstroms. So for semiconductor devices with columnar feature sizes on the order of 10 to 50 nanometers, this material qualifies as "non-porous."

Some masks employed to define the columnar regions in accordance with this invention are referred to as "self-forming." This means that the masks, as laid down, possess the pattern for creating the columnar regions. Hence, there is no need to transfer a pre-defined pattern to the mask by photolithography or other optical technique. More specifically, there is no need for a reticle to define the pattern of columnar regions. As explained in more detail below, when self-forming masks are created on the semiconductor device surface, they possess the arrangement of openings required to establish the location of the columnar regions. These openings may be defined by the positions of certain components in the self-forming masks. For example, if the mask is made from a colloidal suspension, the locations of particles in the suspension define the locations of the openings. And if the mask is made from a thin layer of naturally porous material, the locations of the pores define the locations of the openings.

The term "semiconductor device" as used herein refers to any device formed on a semiconductor substrate or any device possessing a semiconductor material. In many cases, a semiconductor device participates in electronic logic or memory, or in energy conversion. The term "semiconductor device" subsumes partially fabricated devices (such as partially fabricated integrated circuits) as well as completed devices available for sale or installed in particular apparatus. In short, a semiconductor device may exist at any state of manufacture that employs a method of this invention or possesses a structure of this invention.

PROCESS FLOW

In a general case, the process sequence employed to remove the columnar regions (and thereby introduce porosity) is performed only after a potentially damaging planarization process has been completed. The process in question involves (1) forming line paths and/or via holes, (2) filling the structure with conductive material, (3) planarizing by chemical mechanical polishing or other suitable process, and then (4) forming the columnar structures in the dielectric layer.

In one preferred embodiment of the invention, a mask for the columnar structures is formed by using a non-reticle-based technique. For example, a pattern of minute illuminated regions is formed on a photoresist by a mechanism that provides for regions of constructive interference. A diffraction grating or holographic lithographic tool may be used for this purpose. In another example, the mask for generating the columnar structures is a self-forming mask created from a colloidal suspension, a thin porous dielectric layer, a mesoporous polymer/silicate complex, a periodic nanochannel array (e.g., self-ordered anodic porous alumina), etc.

The process flow for one general approach to this invention is depicted in FIG. 1. As illustrated, the process begins at a block 103 with the formation of a layer on the semiconductor device, which layer comprises dielectric material with a pattern of conductive features disposed therein. These conductive features are typically, though not necessarily, metal lines and vias. In one example, they are the interconnects of a metalization layer. In another example, they are a pattern of polysilicon at the gate level of a device. As will be explained below, various techniques may be employed to form such layers.

Typically, as part of the process of forming this layer, excess material will have to be removed from the top (exposed surface) of the layer. Such material may be a metal in the case of a damascene process or a dielectric in the case of non-damascene processes. As depicted in FIG. 1, this material is removed (block 105) by a planarization process to form an exposed pattern of conductive features in the dielectric. One widely-used planarization process is chemical mechanical polishing. This process, or any process like it that applies downward pressure on the partially fabricated semiconductor device, can crack, crush, or otherwise destroy a highly porous low dielectric constant dielectric layer. One benefit of the present invention is that it allows a conventional pressure-based planarization technique in a fabrication technology employing a "porous" dielectric layer. It accomplishes this by introducing the columnar gaps (serving the same function as pores) only after the pressure-based planarization technique has been completed. Note that the invention is not limited to use with planarization process that apply pressure to the underlying dielectric layer.

The procedures for formation of gaps within the dielectric material are depicted in blocks 107 and 109 of FIG. 1. At block 107, a mask of small features is formed over the exposed surface of the semiconductor device. As explained, the exposed surface on which the mask is formed contains both a dielectric layer and a pattern of conductive features within that layer. The small features provided within the mask define locations where the dielectric material will be removed to form gaps.

As explained in more detail below, there are a number of techniques for forming suitable masks. As indicated, the regions or features defined by the mask should be significantly smaller than the line widths or other predominant dimension of the features in the conductive material pattern. Often, this requires that the features of the mask must be on the order of tens of nanometers. To realize these dimensions, the pattern defined by the mask typically will be provided by a non-lithographic (particularly non-photolithographic) technique. Further, as indicated, the mask pattern typically need not be aligned with any particular feature of the exposed pattern of conductive features. In fact, the mask pattern need not be aligned with any feature at all on the semiconductor device or wafer. In some cases, the pattern of features associated with the mask will be transferred to a secondary mask prior to formation of the columnar regions in the dielectric layer.

After the mask has been formed with its regions of exposed and unexposed dielectric, the process involves removing columnar regions of dielectric under the exposed portions of the mask. See block 109. Typically, though not necessarily, the process removes dielectric by an etching process, such as a plasma etch. The depth of the etch may be controlled to penetrate partially into the dielectric or the whole way through the dielectric. Obviously, the more dielectric removed, the lower the dielectric constant of the remaining material.

Note that some openings in the mask pattern will typically reside on top of the conductive features. Therefore, a selective removal technique (e.g., a selective etch chemistry) should be chosen to minimize the amount of conductive material removed. For most applications, it will be desirable to only form columnar gaps in the dielectric, not in the conductive material.

After the columnar gaps have been created in the underlying dielectric layer, those gaps are capped with another layer of material. See block 111. Preferably, though not necessarily, this other layer of material is a non-conformally deposited layer of dielectric. Using a non-conformal deposition process ensures that dielectric material will not fill the gaps in the underlying dielectric layer. In one preferred example, the overlying material is deposited by plasma enhanced chemical vapor deposition (PECVD). This capping layer may serve as part of a next level of metalization, a passivation layer, etc.

Figure 2A:
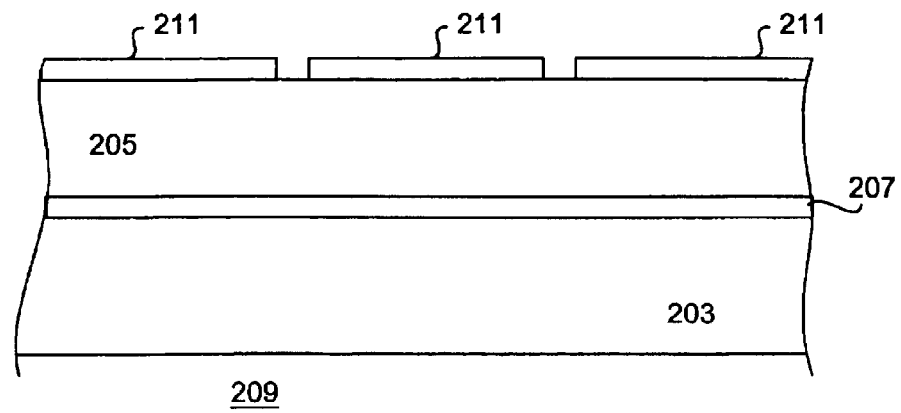
FIG. 2A is a cross sectional diagram of a dielectric layer prior to a via etch in a damascene process.

For context, FIGS. 2A through 2D depict a dual damascene approach to operations 103 and 105 of FIG. 1. In a typical dual damascene process, first and second layers of dense non-porous dielectric are deposited in succession, possibly separated by deposition of an etch stop layer, such as a silicon nitride layer. These layers are depicted in FIG. 2A as first dielectric layer 203, second dielectric layer 205, and etch stop layer 207. These are formed on an adjacent portion of a substrate 209, which portion may be an underlying metalization layer or a gate electrode layer (at the device level).

Figure 2B:
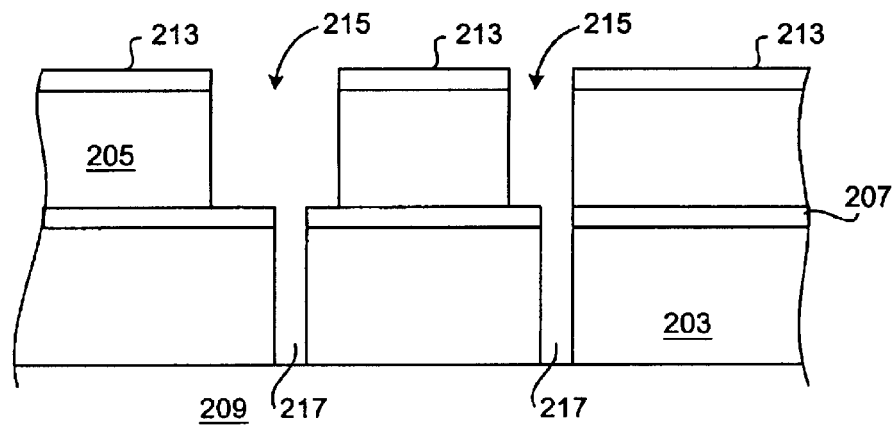
FIG. 2B is a cross sectional diagram of the dielectric layer of FIG. 2A after a line etch has been performed.

After deposition of second dense dielectric layer 205, the process forms a via mask 211 having openings where vias will be subsequently etched. Next, the vias are partially etched down through the level of etch stop 207. Then via mask 211 is stripped off and replaced with a line mask 213 as depicted in FIG. 2B. A second etch operation is performed to remove sufficient amounts of dielectric to define line paths 215 in second dielectric layer 205. The etch operation also extends via holes 217 through first dielectric layer 203, down to contact the underlying substrate 209. See FIG. 2B.

Thereafter, the process forms a thin layer of conductive barrier layer material 219 on the exposed surfaces (including sidewalls) of non-porous dielectric layers 203 and 205. A CVD or PVD operation is typically employed to deposit the barrier layer. On top of the barrier layer, the process deposits conductive metal (typically copper) in the via holes and line paths 217 and 215. Conventionally this deposition is performed in two steps: an initial deposition of a conductive seed layer followed by bulk deposition of copper by electroplating. The seed layer may be deposited by physical vapor deposition, chemical vapor deposition, electroless plating, etc. Note that the bulk deposition of copper not only fills line paths 215 but, to ensure complete filling, covers all the exposed regions on top of second dielectric layer 205.

Thus, it becomes necessary to planarize the structure and remove the excess copper from the device. Planarization removes material down to the level of the top of dielectric layer 205. This results in an exposed pattern of conductive lines 221 in dielectric layer 205 and vias in dielectric layer 203. See the cross-sectional view of FIG. 2C and the simplified top view of FIG. 2D.

Planarization may be accomplished by various techniques. Typically, the process involves some amount of chemical mechanical polishing (CMP). It may also involve a combination of electropolishing, to remove most of the excess bulk copper, followed by CMP to remove the remaining copper down to the level of the top surface of dielectric layer 205.

In accordance with this invention, dielectric layers 203 and 205 are preferably made from a non-porous dielectric material that has sufficient mechanical strength to resist damage during CMP or other pressure-based operation. Further, the dielectric material preferably, though not necessarily, has a relatively low intrinsic dielectric constant; e.g., below about 5. Examples include silicon dioxide (4.2), fluorinated silicate glass (3.6–3.7), silicon oxycarbide (2.7–3.1), SiLK, and the like. Generally, the dense dielectric layers employed with this invention can be prepared by techniques well known to those of skill in the art such as CVD and spin on techniques.

Note that the present invention is not limited to dual damascene processes of the type depicted in FIGS. 2A–2D. It also applies to single damascene and conventional non-damascene processes for forming patterns of conductive features in dielectric layers. One example of a conventional non-damascene approach involves deposition of a blanket layer of conductive material followed by etching of that material to form a pattern of conductive lines, and then deposition of dielectric to provide the insulation between those lines. More fully, the conventional process begins with deposition of a first dielectric layer. Via holes are then etched in that dielectric layer. Those via holes are filled with tungsten or other conductive material, which is planarized to remove the excess material. Thereafter, the process provides a blanket deposition of aluminum or other conductive material used to form the interconnect lines. After covering with an antireflective layer and a mask, the conductive material is etched to form the conductive lines. Then, a dielectric layer is blanket deposited over the conductive lines. That layer is subsequently planarized to produce a planar dielectric surface, with the metal lines embedded below the surface.

Masks Defining Small Columnar Features

Operation 107 of the process depicted in FIG. 1 involves formation of a mask having small openings or blockages distributed over the surface of the partially fabricated semiconductor device. The mask may be formed by any number of suitable techniques. Generally, these techniques will be different from the techniques employed to define line paths or other device features on the semiconductor device. This can be understood as follows. Between alignment limitations and optical limitations based upon the quality of the reticle and the wavelength of the illuminating radiation, the smallest features producible at a given technology node are the line widths of the critical dimension. Because a goal of this invention is to produce columnar features having dimensions significantly smaller than the line widths on the device (essentially to make a porous material), then the mask for the columnar features must employ a fundamentally different patterning technology than that employed to define the lines. Thus, the lithography processes employed to define line paths in a given technology node generally will not be suitable for defining the columnar features required for this invention. The lithography techniques employed to create the line paths simply do not have sufficient resolution to define the much smaller columnar features generated in accordance with this invention. Of course, if one were to fabricate devices having large line widths—substantially larger than the constraints of a fabrication technology—then a photolithography process might be appropriate for creating the columnar features of this invention.

As indicated, the columnar features preferably have a principal dimension that is substantially smaller than the minimum feature size of the electronic design in question (typically the defined line width or critical dimension). In a specific embodiment, the principal dimension of the columnar features is between about one-twentieth and about one-half the defined line width for the design. More preferably, the principal dimension is between about one-tenth and about one-third of the minimum feature size of the design. In the 65 nanometer technology node, a reticle transfers the desired pattern by photolithography using 157 nanometer UV radiation or extreme UV radiation (13 nanometer). In this node, as an example, the principal dimension of the columnar features is at most about 40 nanometers. More preferably, the average principal dimension is between about 5 nanometers and about 25 nanometers.

Two properties are required of a mask. First the mask must define the desired size and arrangement of exposed and blocked regions as specified above. Second, it must resist rapid degradation by the etchant used to remove the dielectric material. In addition, the mask material typically should not interfere with the etching process in a manner that inhibits the desired vertical etch profile in the dielectric. Regarding this last constraint, note that some mask materials interact with the etchant to passivate vertical etching and prevent etch depths beyond a limited depth.

Not all mask materials possess all the required properties. Some are suitable in one regard but not in another. To address this common situation, the pattern of a first mask may be transferred to a more robust secondary mask. Examples of secondary masks that are sufficiently hard to resist degradation during certain etching operations include silicon nitride, silicon oxynitrides, metal oxides, and metals (e.g., zirconium, titanium, molybdenum, and cobalt). Particularly preferred mask materials are metal oxides such as magnesium oxide, zirconium oxide, yttrium oxide ($Y_2O_3$), and aluminum oxide ($Al_2O_3$).

Note that the masks employed with this invention need not conform to all the requirements imposed on conventional masks for device fabrication. For example, because a goal of this invention is to produce a lower k dielectric material, and not to define any particular electronic circuitry, the masks employed with this invention need not be aligned to conductive lines or any other feature on the semiconductor device. Further, the distribution of openings in the mask need not adopt any particular pattern. The distribution may be random or regular or partially random. It may be periodic or aperiodic. And the individual openings may be holes or trenches or nearly any other shape for introducing porosity into the underlying layer. In some cases, the pattern is an "inverse" hole pattern, resulting in solid columns or pillars of dielectric remaining in the layer.

Modern photolithography is performed with a stepper apparatus that aligns to features on a wafer and successively illuminates one or more dies on the wafer. As indicated, the resolution of a photolithography process employed at a given technology node is generally insufficient to generate the columnar features required for this invention. However, other optical techniques may be employed to generate these features. For example, some non-reticle-based techniques may work well. Like conventional techniques, these non-reticle techniques employ a photoresist on the surface of the wafer. And they produce a pattern of illuminated spots or of a connected mesh of illuminated regions. Tools to generate the illumination pattern include, for example, diffraction gratings and holographic lithography devices. These tools are depicted schematically in FIG. 3A.

Diffraction gratings have a regular two-dimensional arrangement of rectangles or other features on a reflective or transmissive surface. As known to those of skill in the art, the distribution of illuminated features produced by a diffraction grating on the partially fabricated integrated circuit (photoresist) can be controlled by the wavelength of the incident radiation, the size and spacing of the features on the diffraction grating, the separation distance between the grating and the wafer, the angle of the wafer with respect to the grating and the angles incidence of light on to the diffraction grating. Particular combinations of these parameters are chosen to provide sub-line width features exposed on to photoresist on the wafer.

As with diffraction grating lithography, holographic lithography projects an image onto the photoresist substrate, and does so without a mask. In the process a "hologram" is illuminated with a monochromatic coherent light source. This generates an interference pattern that projects onto the resist. The hologram is designed so that the interference pattern so generated corresponds exactly to a desired pattern to be imparted to the semiconductor device. In the case of this invention, the hologram defines the positions of the columnar structures to be etched out of the substrate.

Holographic lithography is known to those of skill in the art and described in J. H. Choi et al., "Fabrication and characterisation of field emitter arrays by using TIR holographic lithography," SID International Symposium, Digest of Technical Papers Vol. XXVIII (1997) and F. Clube et al., "Fine-Pattern Lithography for Large Substrates using a Holographic Mask-Aligner," whitepaper of Holotronic Technologies SA, Switzerland (available at the web site of "holotronic.com"/whitepaper/fine_patt.pdf), for example. Both of these references are incorporated herein by reference for all purposes. Briefly, holographic lithography comprises firstly recording a hologram of a pattern defined in a standard photomask. This is performed by placing the photomask at a distance of approximately 100 μm from a holographic recording plate in contact with a prism, and then illuminating the mask with a laser beam whilst simultaneously illuminating the recording layer through the prism with a "reference" laser beam. The pattern recorded in the hologram, or holographic mask, can then be regenerated and printed onto a wafer by illuminating the holographic mask with a single laser beam.

Holographic lithography offers certain advantages over conventional lithographic methods. First, its effective numerical aperture is significantly larger (estimated as ~0.8) compared to that of a stepper (~0.6), so allowing higher resolution for a given exposure wavelength; second, because all points in the hologram are equivalent in terms of imaging quality, the scheme can be readily scaled up for large mask patterns; third, the optical system is very simple, and so is relatively low cost and easily maintained; and last, unlike a conventional mask, holographic information storage has large redundancy, so the holographic masks are relatively insensitive to contamination by dust.

Regardless of whether the process uses a diffraction grating, holographic lithography apparatus, or other optical technique, the pattern is transferred to the underlying mask before etching. Often, depending upon the etch chemistry, a secondary mask made of a sacrificial material must be employed to transfer the pattern from the photoresist prior to etching. As mentioned, such material is preferably, though not necessarily, a metal oxide.

Figure 3A:
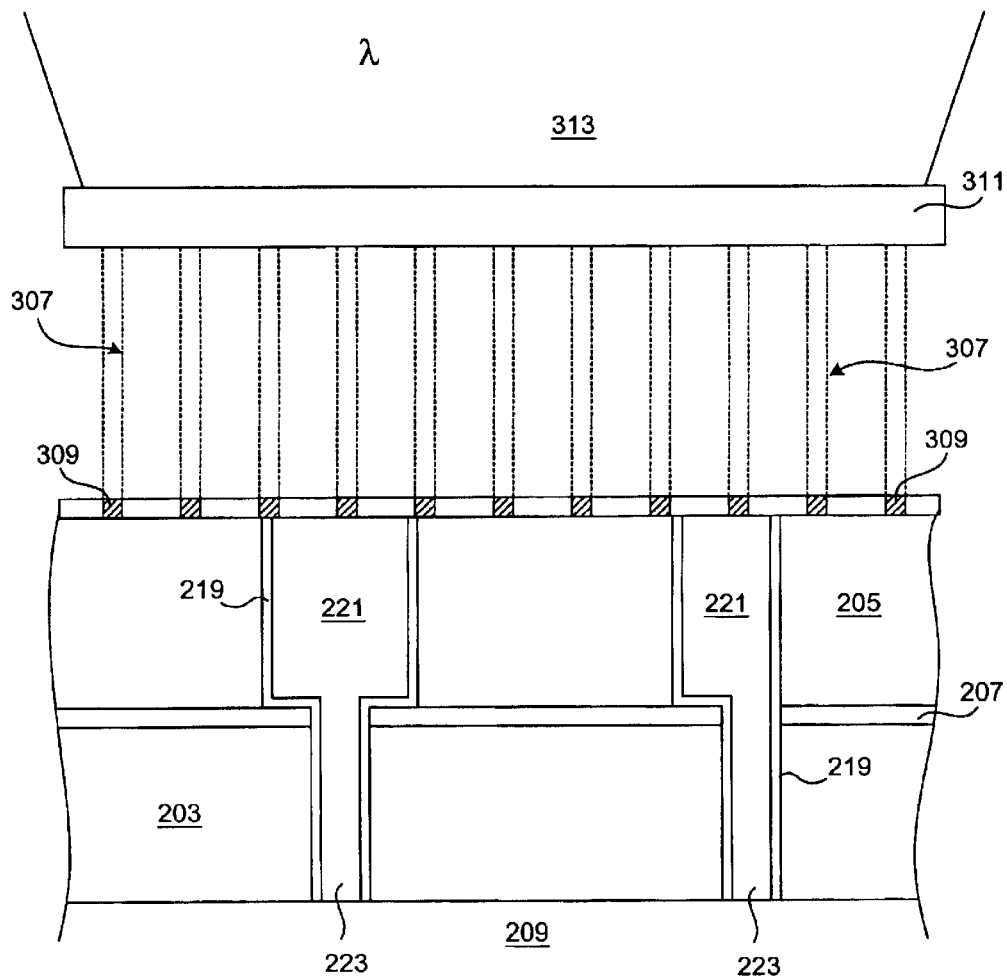
FIG. 3A is a simplified schematic diagram of an optical technique for generating a mask suitable for removing columnar regions of dielectric in accordance with an embodiment of this invention.

As depicted in FIG. 3A, one optical process for forming a mask in accordance with certain embodiments of this invention employs a sacrificial layer of hard mask material 303 and an exposed layer of photoresist 305. These layers are provided directly on top of a planarized surface 301 for a patterned layer of conductive features. The hard mask layer 303 is formed beneath the photoresist layer 305.

The photoresist layer is illuminated with an illumination pattern 307 to produce exposed regions 309. The illumination pattern 307 is in turn created by an optical element 311 that may be an interference element such as a diffraction grating or holographic element: Optical element 311 receives light radiation from an arbitrary source to produce illumination pattern 307. While optical element 311 is depicted as a transmission based element, it could as well be a reflective element. Optical techniques employing diffraction gratings or holographic lithography typically produce a non-random arrangement of columnar regions 361 as depicted in the device top view shown in FIG. 3C.

As an alternative to the optical techniques, self-forming masks may be employed. With these masks, there is no need to imprint a pattern on the mask material. Rather, the pattern "self forms" in the mask material. Self-forming masks may be deposited on a dense substrate by various techniques. These include spin on techniques, PVD techniques, and CVD techniques. Sometimes, the deposited mask must undergo an additional post-deposition operation to produce the distribution of openings. One such operation involves evaporation of one phase in a multi-phase mask material. This leaves behind a number of sub-line width sized holes or other features where the evaporated component resided in the multi-phase mask material. Another self-forming operation involves removing a polymer or other support matrix that links together a series of particles that remain to serve as the mask.

Figure 2C:
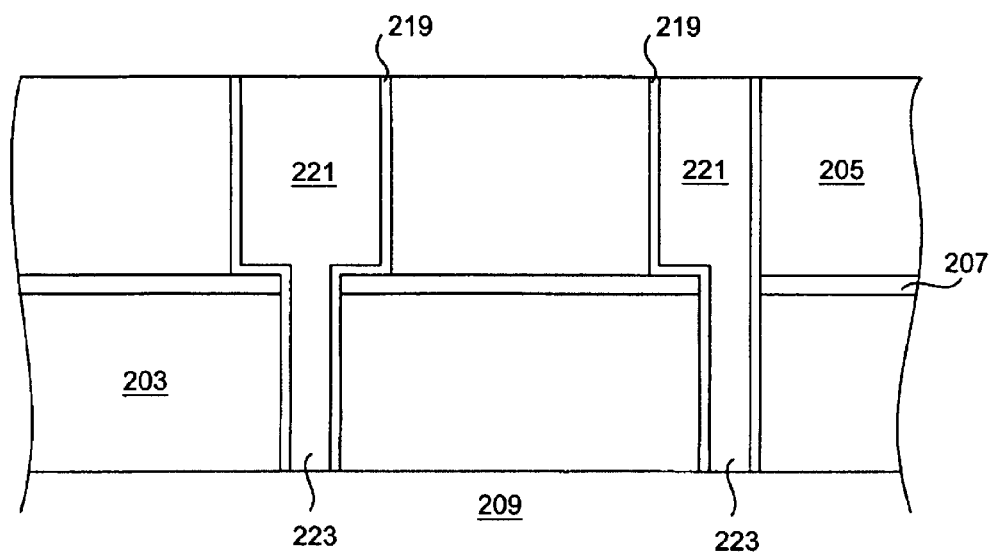
FIG. 2C is a cross sectional diagram of the dielectric layer of FIGS. 2A and 2B after the etched regions have been filled with metal to form lines and vias.
Figure 2D:
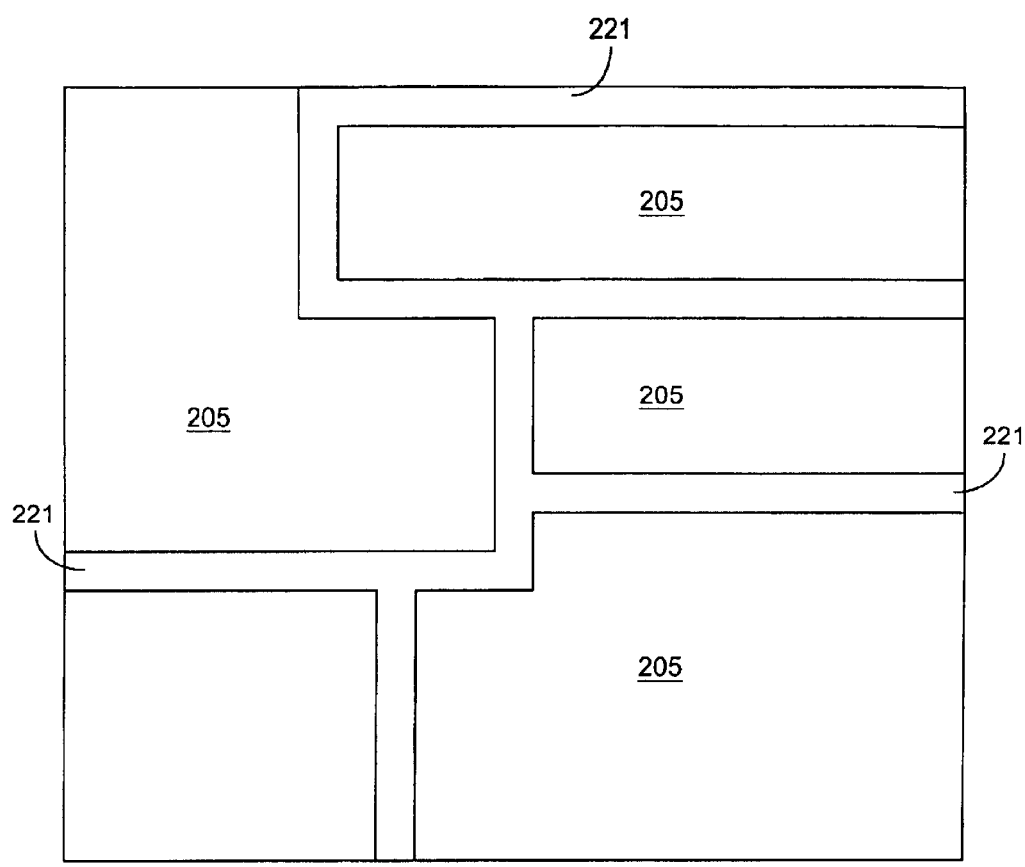
FIG. 2D is a top view of a simplified version of the layer prepared as in FIG. 2C.
Figure 3B:
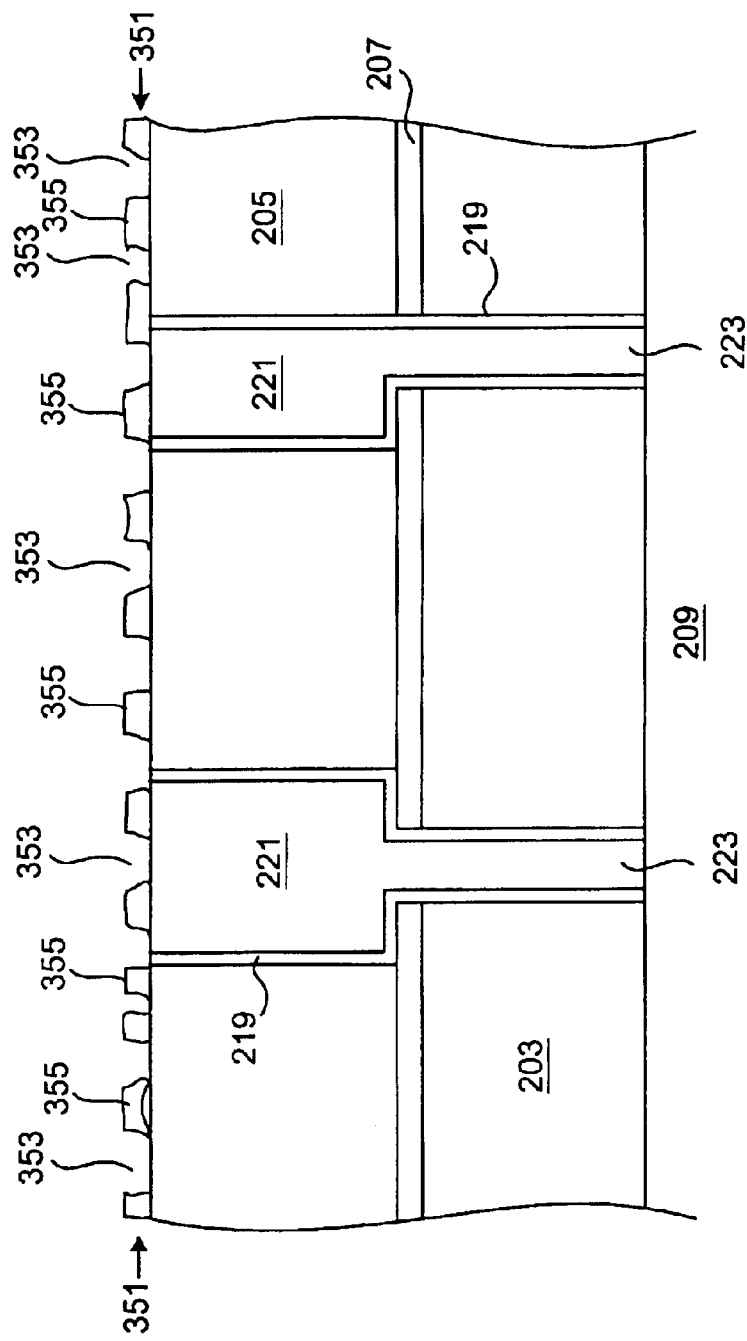
FIG. 3B is a simplified schematic diagram depicting a self-forming mask on a planarized surface of a metalization layer.
Figure 3C:
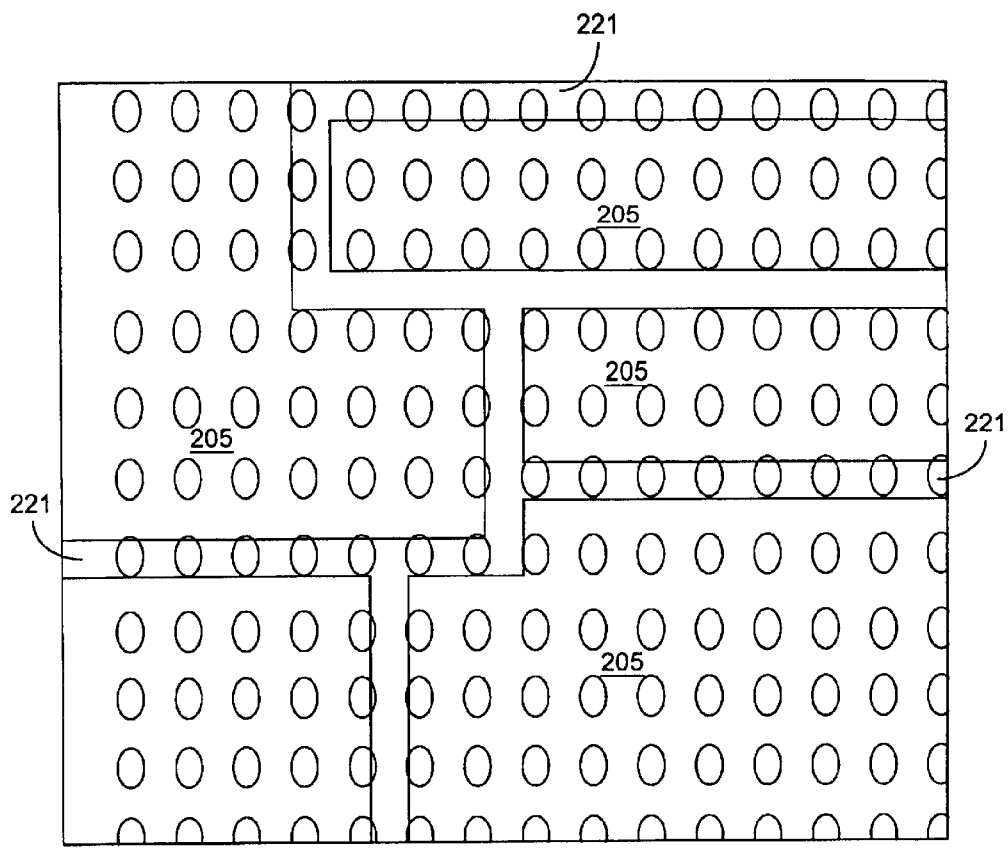
FIG. 3C is a top view of a mask having a periodic arrangement of openings for removing dielectric in accordance with this invention.
Figure 3D:
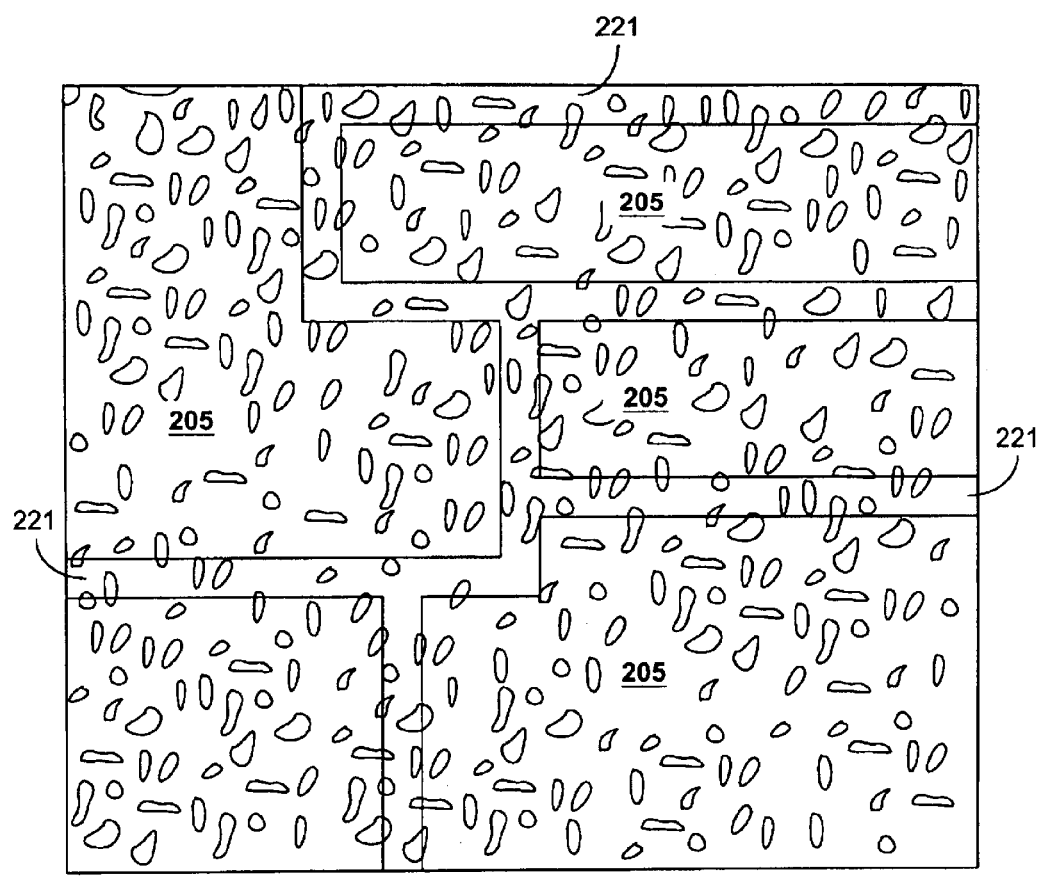
FIG. 3D is a top view of a mask having an aperiodic arrangement of openings in accordance with the embodiment of this invention.

An example of a self-forming mask is depicted in FIG. 3B. As shown there, the underlying structure produced by a process sequence employed to generate the structure shown in FIG. 2C is coated with a mask 351 having a number of regions of a separate phase 353. Another component of mask 351 is a matrix phase 355. Prior to etching, one of phase 353 and phase 355 is removed to provide a pattern of small features defining the columnar regions to be formed in the underlying dielectric layer or layers 205 and 203. A top view of the mask and underlying device is depicted in FIG. 3D. As shown there, the mask provides a random arrangement of openings 363.

Examples of self-forming mask materials that can generate exposure patterns suitable for at least some applications include colloidal suspensions, mesoporous polymer/silicate complexes, nanochannel arrays (e.g., porous anodized aluminum), aerogels and xerogels, and any other materials possessing pores of the appropriate size scale. Many different materials resulting from nanotechnology will possess the proper combination of blocked and exposed regions. Often these materials will produce periodic distributions of openings.

One exemplary technique for making self-forming masks involves forming a truly porous dielectric layer as the mask on top of the previously planarized layer of conductive features and dielectric. If the material, as deposited, has a porous structure, no further processing is required to self-form the pores. Otherwise, additional processing (e.g., evaporation) is required. Regardless of how the porous material is formed, the pores of the mask material should have an average size in the range of interest, e.g., between about one tenth and one third the line width of the conductive features. Further, in order that the pores can serve as openings in the mask to allow etching, the overall thickness of the mask material should be on the same order as the pore size, or preferably just slightly thinner than the average pore size. Thus, for the 65 nanometer technology node, the average pore size of the mask, and the mask thickness should be between about 5 nanometers and 35 nanometers, more preferably between about 10 and 25 nanometers.

Colloidal suspensions represent another class of self-forming mask. Pertinent parameters characterizing a colloidal suspension include the average particle size, the particle size distribution, and the number of particles in a deposited layer of colloid. The number of particles dictates how dense will be the distribution of openings in the mask. A thin layer of the colloidal suspension is deposited on the patterned metal surface as a precursor to the mask. Then the continuous phase is removed to leave behind a pattern of particles defining the mask. Alternatively, the particles are removed and the continuous phase remains to define a mask having holes where the particles once resided.

In a particularly preferred embodiment, the mask is made from a silicalite-containing porous material such as one of those described in U.S. Pat. No. 6,329,062 B1 issued Dec. 11, 2001 and incorporated herein by reference for all purposes. For example, the mask may be made from a silicalite/binder porous material using silicalite nanocrystals smaller than the characteristic dimensions of the features on the integrated circuit device. The binder is an amorphous porous material that links the silicalite nanocrystals together and is formed from a precursor which polymerizes on heating. In one embodiment, the silicalite nanocrystals are supplied as a colloidal suspension or slurry. The slurry and binder precursor are spincoated onto a substrate and thermally treated to polymerize the binder precursor and drive off solvent in the slurry, forming the porous silicalite/binder material. Thereafter, the binder is removed to leave behind the silicalite nanocrystals as a mask. Alternatively, the silicalite nanocrystals are removed by hydrogen fluoride for example to leave the binder as a mask.

Silicalites are microporous crystalline oxides of silicon that are pure-silica analogs of zeolites. Generally, they should be smaller than the characteristic dimensions of the features on the integrated circuit device. Preferably, the individual silicalite crystals are no larger than about 20% of the defined line width and a statistically insignificant number of the crystals have a long axis greater than about 40% of the defined line width.

As mentioned, the binder is formed from a binder precursor material, which, on heating, polymerizes or crosslinks. Examples of useful binder precursors include tetraethoxysilane (TEOS), tetramethoxysilane (TMOS), methylsilsesquioxane, hydridosilsesquioxane, and organic polymers such as poly(arylene ethers) and benzocyclobutenes. Alternatively, the binder material may be a porous amorphous silica.

Nanochannel arrays are yet another class of self-forming mask suitable for use with this invention. These materials generally comprise a periodic array of pores (channels) or other openings. Generally, the pores have a fixed center-to-center separation distance ("periodicity") and a fixed principal dimension, typically a diameter. In one specific embodiment, the nanochannel array has a periodicity of at most about 100 nanometers (more preferably at most about 50 nanometers) and a channel diameter of at most about 50 nanometers (more preferably at most about 25 nanometers).

In one approach, a suitable nanochannel array is self-formed by anodizing thin layers of aluminum. The resulting alumina comprises an array of contacting hexagons, each with a channel in its center. By carefully controlling the anodization process, one can generate high aspect ratio, periodic pores of small diameter in an alumina matrix. See Asoh et al., "Fabrication of Ideally Ordered Anodic Porous Alumina with 63 nm Hole Periodocity Using Sulfuric Acid," J. Vac. Sci. Technol. B 19(2), March/April 2001, Pages 569–572, Asoh et al., "Conditions for Fabrication of Ideally Ordered Anodic Porous Alumina Using Pretextured Al," Journal of the Electrochemica Society, 148 (4) B152–B156 (2001) Pages B152–B156, Holland et al., "Nonlithographic Technique for the Production of Large Area High Density Gridded Field Sources," J. Vac. Sci. Technol. B 17(2), Mar/Apr. 1999, Pages 580–582, and Masuda et al. "Highly Ordered Nanochannel-Array Architecture in Anodic Alumina," App. Phys. Lett. 71(19), November 1997, Pages 2770–2772. Each of these references is incorporated herein by reference for all purposes. Generally, the pore size can be easily controlled by varying the anodization voltage. Pore sizes in the tens of nanometers are easily attained.

In some cases, the aluminum layer may be pretexturized to control periodicity and/or pore size. Pretexturing involves pressing a "mold" having the desired periodicity against the aluminum layer prior to anodization. In one reported example, the mold is a silicon carbide sheet having an array of convex regions defined by electron beam lithography. Because the mold defines the periodicity of the self-forming mask, it is important that it be produced using a technology having a resolution greater than the defined line width of the device fabrication technology.

Other pattern forming materials may be employed as self-forming nanochannel arrays. Some of these rely on an intrinsic chemical reactivity or etch contrast. Others rely solely on topological variations. With such variations a neutral etch may be employed. In either case, the self-forming material may serve as a sacrificial or primary mask, whose pattern is transferred to an underlying hard mask.

One examples of a nanoscale self-forming mask formed by an intrinsic chemical pattern is a diblock copolymers having reverse micelles self-ordered on the substrate surface. These features are selectively derivatized to provide intrinsic etch contrast. See Spatz, J. P.; Eibeck P.; Mossmer, S.; Moller, M.; Herzog, T.; Ziemann, P. Adv. Mater. 1998, 10, 849–852 and Spatz, J. P.; Herzog, T.; Mossmer, S.; Ziemann, P.; Moller, M., Adv. Mater. 1999, 11, 149–153, both of which are incorporated herein by reference for all purposes. In another example, the nanoscale mask forming process exploits the selective chemical reactivity of different components of a block copolymer. For example, a reaction of polybutadiene components in a polystyrene matrix give topology variations necessary for etching. See Park, M.; Harrison, C.; Chaikin, P. M.; Register, R. A.; Adamson, D. H. Science 1997, 276, 1401–1404, Li, R. R.; Dapkus, P. D.; Thompson, M. E.; Jeong, W. G.; Harrison, C.; Chaikin, P. M.; Register, R. A.; Adamson, D. H. Appl. Phys. Less. 2000, 76, 1689–1691 and Harrision, C.; Park, M.; Chalkin, P. M.; Register R. A.; Adamson, D. H. J. Vac. Sci Technol. B 1998, 16, 544–552, each of which is incorporated herein by reference for all purposes. Another variation involves the use of a diblock copolymer that has intrinsic etch contrast. See Lammertink, R. G. H.; Hempenius, M. A.; van den Enk, J. E.; Chan, V. Z. H.; Thomas, E. L.; G. J. Adv Mater, 2000, 12, 98–103, which is incorporated herein by reference for all purposes.

One example of a process that produces an intrinsic topological variation is a two-dimensional array of bacterial proteins having 6 nanometer features with 25 nanometer periodicity over 1 centimeter squared of surface area. See Douglas, K.; Devaud, G.; Clark, N. A. Science 1992, 257, 642–644 and Holland, B. W.; Douglas, K.; Clark, N. A. Mater. Res. Soc. Symp. Proc. 1994, 330 (Biomolecular Materials by Design), 121–126, both of which are incorporated herein by reference for all purposes. Still further, arrays of surface micelles can be formed from symmetric amphiphilic block copolymers such as polystyrene(510)-b-poly-2-vinylpyridine(480). The dimensions of the features in the desired mask can be tailored by choosing appropriate block lengths. See Meli et al., "Self-Assembled Masks for the Transfer of Nanometer-Scale Patterns into Surfaces: Characterization by AFM and LFM", Nano Letters, Vol. 2, No. 2, Pages 131–135 (2002) which is incorporated herein by reference for all purposes.

Yet another approach involves depositing a thin metal film (e.g., 10 to 50 nanometers of copper) on a material that the metal does not wet well. Subsequent heating will cause the metal to agglomerate, leaving isolated mounds of metal. These form the mask pattern for etching the underlying dielectric.

In another embodiment, any exposed metal features within the layer of dielectric are selectively protected prior to (or after) forming the mask defining the columnar regions. Preferably, this involves selectively forming a metal cap that completely covers the exposed metal features. This protects the metal from etching to remove the columnar regions of dielectric. Hence, the dielectric etch conditions may be more aggressive or less selective.

Etching Sub-Critical Dimension Columnar Features

To form the columnar structures and thereby lower the dielectric constant, material must be removed from the dielectric layer. Generally, this material is removed under the mask openings by etching. The etching should selectively remove dielectric but not conductive materials. Many etch conditions known to those of skill in the art meet this requirement.

In addition, the etching should create relatively deep, high aspect ratio columnar regions in the dielectric. To this end, the etch conditions should not create significant quantities of polymer or other material that would deposit on the sidewalls of partially etched holes or trenches to passivate the etch reaction and thereby truncate the hole or trench. It is known that widely used fluorocarbon etchants (e.g., $CF_4$) react with resist on the substrate surface to create non-volatile fluoropolymer products that deposit on trench sidewalls and passivate etching. This effect can be harnessed to control etching in relatively large dimension feature openings. However, for the nanoscale openings employed in the masks of this invention, the polymer coatings will truncate etching before significant hole or trench depth is attained. Thus, the etchant should not produce significant amounts of polymer product. A fluorine etch does not produce significant quantities of polymeric byproducts, but it is rather non-selective. It will, for example, readily etch conventional hard mask materials such as silicon nitride.

Figure 4:
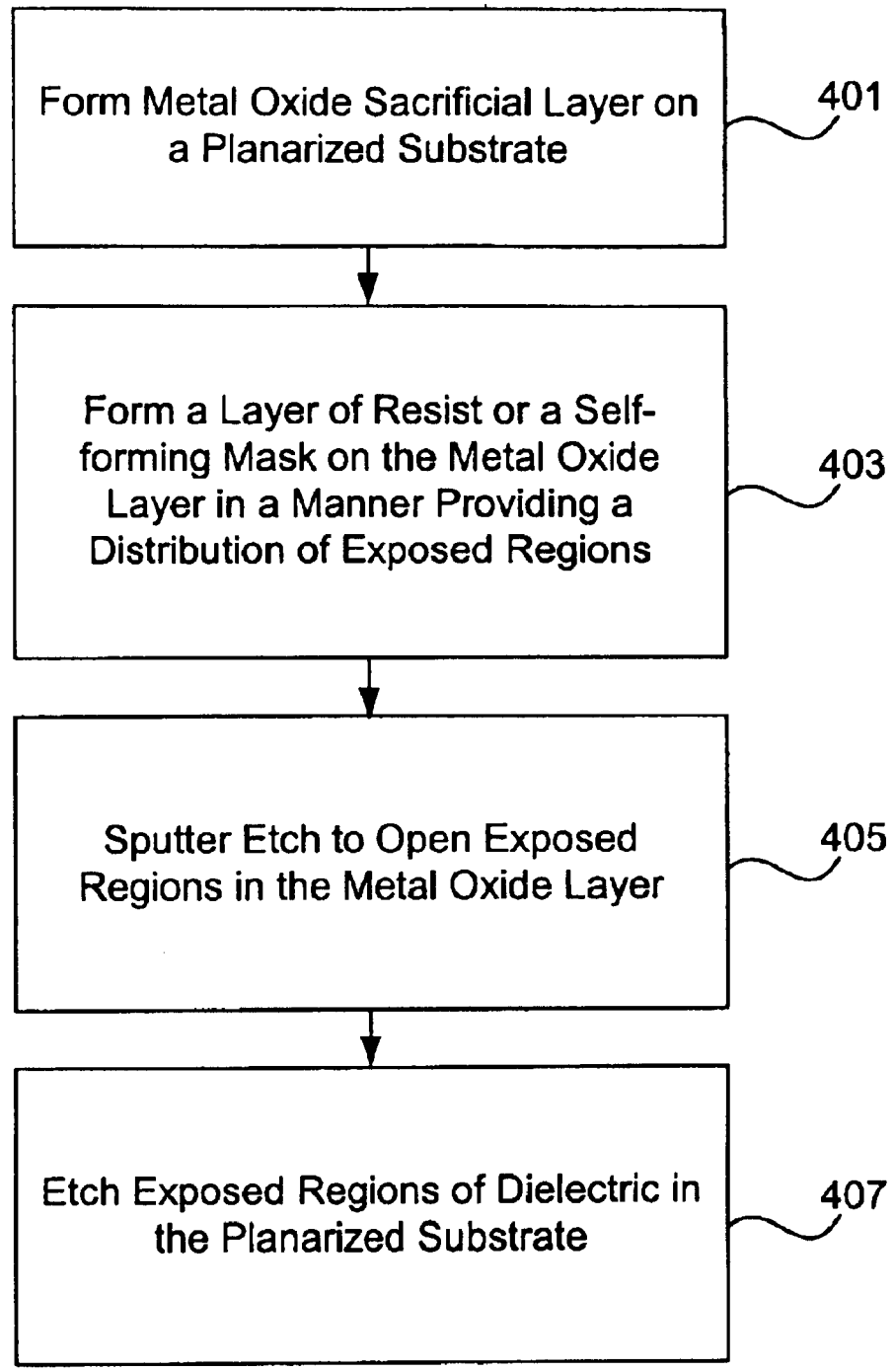
FIG. 4 is a process flow diagram depicting one method for using primary and secondary masks in accordance with this invention.

To address these obstacles, one aspect of this invention employs a fluorine etch with a metal oxide hard mask. Certain metal oxides such as magnesium oxide and zirconium oxide resist fluorine etch and are therefore used as a hard mask. One embodiment of this invention is depicted in FIG. 4. As shown there a process begins at 401 with formation of a metal oxide sacrificial layer on the planarized surface of layer containing conductive features and a dielectric. Then, at block 403, a resist or self-forming mask is deposited on the metal oxide layer and a pattern of exposed regions results. Next, at block 405, the metal oxide layer is etched with an argon sputter etch for example. Finally, at 407, the exposed regions of dielectric are etched using fluorine containing etch, for example. This removes the columnar regions of dielectric to produce the low-k dielectric layers of this invention.

One suitable process for forming a sacrificial metal oxide layer involves RF-diode sputter deposition employing a metal oxide target in an RF-plasma. Another process involves reactive DC-magnetron sputter deposition employing a metal target in an $Ar/O_2$ plasma. Yet another approach involves CVD employing an appropriate organometallic precursor.

Exemplary etch chemistries include fluorine, oxygen, and carbon tetrafluoride. Sulfur hexafluoride may also be used. Generally, the etch process should be highly anisotropic, with essentially no lateral etch component. Further, the etch should be highly selective, preferably meeting the requirement of producing 500–1000 nanometer deep holes in dielectric protected with a 20 nanometer thick mask.

Other Embodiments

While this invention has been described in terms of a few preferred embodiments, it should not be limited to the specifics presented above. Many variations on the above-described preferred embodiments, may be employed. For example, while the invention has been described primarily in terms of preparing "porous" dielectrics in integrated circuits, it is not so limited. In some embodiments, the invention may be employed in non-semiconductor devices. In addition, it may be employed to prepare low dielectric constant semiconductor materials such as low-k silicon layers. In such cases, the invention involves depositing a mask of the type described herein on an exposed region of semiconductor and then etching columnar regions in the semiconductor region to lower the dielectric constant. Note that such materials have applications in coupling radio frequency input lines to integrated circuit processing logic. Therefore, the invention should be broadly interpreted with reference to the following claims.

What is claimed is:

1. A method of forming a low dielectric constant dielectric layer in a semiconductor device, the method comprising:
   (a) depositing dielectric and conductive material to form a pattern of conductive lines in a dielectric layer;
   (b) planarizing the semiconductor device to produce an exposed pattern of the conductive lines in the dielectric layer, wherein the conductive lines have a defined line width;
   (c) after (b), removing or leaving columnar regions of dielectric in the dielectric layer, wherein the columnar regions have an average feature dimension substantially smaller than the defined line width; and
   (d) depositing material over the columnar regions to form gaps in the dielectric material and thereby lower an effective dielectric constant of the dielectric layer.

2. The method of claim 1, wherein the conductive lines comprise a metal.

3. The method of claim 2, wherein the metal is copper.

4. The method of claim 1, wherein the conductive lines and the dielectric layer comprise a metalization layer of the semiconductor device.

5. The method of claim 1, wherein the dielectric layer comprises a non-porous material.

6. The method of claim 1, wherein the dielectric layer comprises a material selected from the group consisting of silicon oxide, silicon oxycarbide, fluorinated silicate glass, silicon nitride, spin-on organic materials, spin-on inorganic materials, and spin-on inorganic-hybrid materials.

7. The method of claim 1, wherein depositing the dielectric and conductive material comprises:
   first forming the dielectric layer, defining line paths within the dielectric layer, and then depositing the conductive material in the line paths; and
   wherein the planarizing comprises removing conductive material from on top of the dielectric layer.

8. The method of claim 7, wherein the conductive material is copper.

9. The method of claim 1, wherein the planarizing comprises chemical mechanical polishing.

10. The method of claim 1, wherein the columnar regions are holes.

11. The method of claim 1, wherein the columnar regions are trenches.

12. The method of claim 1, wherein the average feature dimension is between about 0.1 and about 0.35 times the defined line widths.

13. The method of claim 1, wherein the average feature dimension is between about 10 nanometers and about 40 nanometers.

14. The method of claim 13, wherein the average feature dimension is the average diameter of holes or pillars comprising the removed or remaining columnar regions of dielectric.

15. The method of claim 1, further comprising depositing a mask over the exposed pattern of conductive lines and dielectric to define the columnar regions of the dielectric layer.

16. The method of claim 15, wherein the mask is a metal oxide.

17. The method of claim 16, wherein the metal oxide mask is a secondary mask.

18. The method of claim 15, wherein the columnar regions defined by the mask are not aligned with the conductive lines.

19. The method of claim 15, wherein the columnar regions defined by the mask are provided by a diffraction grating, holographic lithography, particles in a colloidal suspension, pores in a porous material, or channels in a nanochannel array.

20. The method of claim 15, wherein removing or leaving columnar regions of dielectric comprises selectively etching the dielectric layer without substantially etching the conductive lines.

21. The method of claim 1, wherein depositing material over the columnar regions comprises forming a metalization layer over the dielectric layer.

22. The method of claim 1, wherein depositing material over the columnar regions comprises depositing dielectric material over the dielectric layer.

23. The method of claim 22, wherein the dielectric materials deposited by a non-conformal deposition method.

24. The method of claim 23, wherein the non-conformal deposition method is a PECVD technique.

25. The method of claim 1, further comprising:
selectively depositing a mask over the exposed conductive lines; and
depositing a porous mask dielectric, which mask defines the columnar regions of the dielectric layer.

26. A method of forming a layer of low dielectric constant dielectric in a semiconductor device, the method comprising:
(a) providing a layer of dielectric having a pattern of conductive features located therein;
(b) providing a mask over the layer of dielectric, wherein the mask has self-forming exposed regions that are not aligned with the pattern of conductive features; and
(c) etching away columnar regions of the layer of dielectric defined by the exposed regions to form the low dielectric constant dielectric, while not substantially etching the conductive features.

27. The method of claim 26, wherein the pattern of conductive features comprises conductive lines of a metalization layer.

28. The method of claim 26, wherein the conductive features comprise copper.

29. The method of claim 26, wherein the dielectric layer comprises a material selected from the group consisting of silicon oxide, silicon oxycarbide, fluorinated silicate glass, silicon nitride, spin-on organic materials, spin-on inorganic materials, and spin-on inorganic-hybrid materials.

30. The method of claim 26, wherein providing the layer of dielectric having a pattern of conductive features located therein comprises first forming the dielectric layer, defining line paths within the dielectric, and then depositing the conductive material in the line paths.

31. The method of claim 30, wherein the conductive features comprise copper.

32. The method of claim 26, wherein the columnar regions are holes.

33. The method of claim 26, wherein the pattern of conductive features comprises conductive lines of a defined line width, and wherein the exposed regions of the mask have an average feature dimension of between about 0.1 and about 0.35 times the defined line width.

34. The method of claim 33, wherein the average feature dimension is between about 10 nanometers and about 40 nanometers.

35. The method of claim 26, wherein the mask comprises a metal oxide.

36. The method of claim 35, wherein the metal oxide is selected from the group consisting of magnesium oxide, zirconium oxide, yttrium oxide, and aluminum oxide.

37. The method of claim 26, wherein the exposed regions of the mask are defined by particles in a colloidal suspension, pores in a porous material, or channels of a nanochannel array.

38. The method of claim 26, further comprising depositing material over the columnar regions to form gaps in the dielectric material and thereby lower the dielectric constant of the dielectric.

39. The method of claim 38, wherein depositing material comprises depositing the dielectric material over the columnar regions by a non-conformal deposition process.

40. A method of forming a layer of low dielectric constant dielectric in a semiconductor device, the method comprising:
(a) providing a layer of dielectric having a pattern of conductive features located therein;
(b) providing a mask over the layer of dielectric, wherein the mask has exposed regions that are not aligned with any features of the semiconductor device; and
(c) etching away columnar regions of the layer of dielectric defined by the exposed regions to form the low dielectric constant dielectric, while not substantially etching the conductive features.

41. The method of claim 40, wherein the pattern of conductive features comprise conductive lines of a metalization layer.

42. The method of claim 40, wherein the dielectric layer comprises a material selected from a group consisting of silicon oxide, silicon oxycarbide, fluorinated silicate glass, silicon nitride, spin-on organic materials, spin-on inorganic materials, and spin-on inorganic-hybrid materials.

43. The method of claim 40, wherein the pattern of conductive features comprise conductive lines of a defined line width and wherein the exposed regions of the mask have an average feature dimension of between about 0.1 and about 0.35 times the defined line width.

44. The method of claim 40, wherein the average feature dimension is between about 10 nanometers and about 40 nanometers.

45. The method of claim 40, wherein the mask comprises a metal oxide.

46. The method of claim 40, wherein the exposed regions of the mask are provided by a diffraction grating or holography.

47. A method of forming a layer of low dielectric constant semiconductor in a device, the method comprising:
(a) providing a region of exposed semiconductor on the device;
(b) providing a mask over the region of semiconductor, wherein the mask has self-forming exposed regions that are not aligned with any features of the device; and
(c) etching away columnar regions of semiconductor defined by the exposed regions to form the low dielectric constant semiconductor.

48. The method of claim 47, wherein the exposed regions of the mask are defined by particles in a colloidal suspension, pores in a porous material, or channels of a nanochannel array.

* * * * *